(12) United States Patent
Yang et al.

(10) Patent No.: US 12,188,646 B2
(45) Date of Patent: Jan. 7, 2025

(54) LED FLEXIBLE WIRE LIGHTING IN PARALLEL-SERIES CONNECTION

(71) Applicant: HANGZHOU YUN LED CHIP PHOTOELECTRICITY TECH. CO., LTD., Hangzhou (CN)

(72) Inventors: Yinghan Yang, Hangzhou (CN); Zixun Zhang, Hangzhou (CN)

(73) Assignee: HANGZHOU YUN LED CHIP PHOTOELECTRICITY TECH. CO., LTD., Hangzhou (CN)

( * ) Notice: Subject to any disclaimer, the term of this patent is extended or adjusted under 35 U.S.C. 154(b) by 1 day.

(21) Appl. No.: 18/153,340

(22) Filed: Jan. 11, 2023

(65) Prior Publication Data

US 2023/0146561 A1    May 11, 2023

Related U.S. Application Data

(63) Continuation of application No. PCT/CN2021/108091, filed on Jul. 23, 2021.

(30) Foreign Application Priority Data

Sep. 2, 2020    (CN) .............................. 202010909848

(51) Int. Cl.
*F21V 23/00*    (2015.01)
*F21V 19/00*    (2006.01)
(Continued)

(52) U.S. Cl.
CPC .......... *F21V 23/005* (2013.01); *F21V 19/002* (2013.01); *F21V 23/007* (2013.01); *F21Y 2103/10* (2016.08); *F21Y 2115/10* (2016.08)

(58) Field of Classification Search
CPC ........ F21S 4/00–28; F21V 19/00–0075; F21V 23/00–06; F21V 25/00; F21Y 2103/10;
(Continued)

(56) References Cited

U.S. PATENT DOCUMENTS

| | | | | |
|---|---|---|---|---|
| 5,404,282 A | * | 4/1995 | Klinke | F21S 43/14 |
| | | | | 362/249.14 |
| 9,966,367 B2 | * | 5/2018 | Ishizaki | F21V 29/74 |

FOREIGN PATENT DOCUMENTS

| | | |
|---|---|---|
| CN | 109798495 A | 5/2019 |
| CN | 110617414 A | 12/2019 |
| (Continued) | | |

OTHER PUBLICATIONS

China International Search Report in Application No. PCT/CN2021/108091, mailed on Sep. 28, 2021.

*Primary Examiner* — Jason M Han

(74) *Attorney, Agent, or Firm* — Syncoda LLC; Feng Ma

(57) ABSTRACT

An LED flexible wire lighting in parallel-series connection includes: first flexible wire, second flexible wire, third flexible wire, and a plurality of SMD LED groups; said first flexible wire, said second flexible wire and said third flexible wire are enclosed by non-conductive material without conduction among the wires; said plurality of SMD LED groups are numbered as the first SMD LED group, the second SMD LED group, . . . , the Nth SMD LED group; said plurality of SMD LED groups are connected electrically between said first flexible wire and said second flexible wire in order of said SMD LED groups' number; said third flexible wire is the cathode of said LED flexible wire lighting, and said first flexible wire is the anode of said LED flexible wire lighting. The manual welding connection is reduced and the resistance to tension of lightings in parallel-series connection is enhanced.

8 Claims, 2 Drawing Sheets

(51) Int. Cl.
*F21Y 103/10* (2016.01)
*F21Y 115/10* (2016.01)

(58) Field of Classification Search
CPC .... F21Y 2115/10; H05K 1/189; H05K 3/328; H05K 2201/10106
See application file for complete search history.

(56) References Cited

FOREIGN PATENT DOCUMENTS

| | | |
|---|---|---|
| CN | 110726081 A | 1/2020 |
| CN | 110726082 A | 1/2020 |
| CN | 110736034 A | 1/2020 |
| CN | 111998252 A | 11/2020 |

* cited by examiner

LED FLEXIBLE WIRE LIGHTING IN PARALLEL-SERIES CONNECTION

CROSS-REFERENCE TO RELATED APPLICATIONS

This is a continuation of International Application No. PCT/CN2021/108091 filed on Jul. 23, 2021, which claims priority to Chinese Patent Application No. 202010909848.1 filed on Sep. 2, 2020. The disclosures of the above-referenced applications are hereby incorporated by reference in their entirety.

BACKGROUND

RGB lighting with DIP LEDs can be manufactured by automatic machines in parallel-series connection or in series-parallel connection. The current of the lighting products could be decreased to minimize wire losses by higher supply voltage in parallel-series connection or in series-parallel connection.

It is difficult to reach a high waterproof level for the structure character of DIP RGB lightings although DIP RGB lightings are used broadly. And it is hard to decrease the cost of DIP LED lighting for the low manufacturing efficiency.

In recently, the SMD lightings, such as copper lightings, are used broadly in RGB lighting market. The SMD LEDs are mount on the two copper wires at the welding positions with the non-conduct protection opened. The SMD LEDs are encapsulated by a solidified material. Those are disclosed in Chinese Patent No. CN209325702U and CN202756984U.

The efficiency is increased by the copper lighting automatic manufacturing. But, it is low efficiency still to manually connect the lightings in parallel-series connection or in series-parallel connection.

SUMMARY

The present invention relates to the field of LED Christmas lighting. The present invention further relates to an LED flexible wire lighting in parallel-series connection.

To solve the problems in current technologies mentioned above, some embodiments disclosed herein provide an LED flexible wire lighting in parallel-series connection.

An LED flexible wire lighting in parallel-series connection, comprises:

first flexible wire, second flexible wire, third flexible wire, and a plurality of surface mounted device (SMD) LED groups;

said first flexible wire, said second flexible wire and said third flexible wire are enclosed by non-conductive material without conduction among the wires;

said plurality of SMD LED groups are numbered as the first SMD LED group, the second SMD LED group, . . . , the Nth SMD LED group; said SMD LED groups with odd numbers are odd SMD LED groups, said SMD LED groups with even numbers are even SMD LED groups;

said plurality of SMD LED groups are connected electrically between said first flexible wire and said second flexible wire in order of said SMD LED groups' number; the anodes of said odd SMD LED groups are connected electrically to said first flexible wire, the cathodes of said odd SMD LED groups are connected electrically to said second flexible wire; the cathodes of said even SMD LED groups are connected electrically to said first flexible wire, the anodes of said even SMD LED groups are connected electrically to said second flexible wire; said first flexible wire is cut to non-conduction at each point between the anode of said odd SMD LED group and the cathode of the next even SMD group; said second flexible wire is cut to non-conduction at each point between the anode of said even SMD LED group and the cathode of the next odd SMD group; the cathode of said Nth LED group is connected electrically to said third flexible wire; said third flexible wire is the cathode of said LED flexible wire lighting, and said first flexible wire is the anode of said LED flexible wire lighting;

alternatively:

said plurality of SMD LED groups are connected electrically between said first flexible wire and said second flexible wire in order of said SMD LED groups' number; the cathodes of said odd SMD LED groups are connected electrically to said first flexible wire, the anodes of said odd SMD LED groups are connected electrically to said second flexible wire; the anodes of said even SMD LED groups are connected electrically to said first flexible wire, the cathodes of said even SMD LED groups are connected electrically to said second flexible wire; said first flexible wire is cut to non-conduction at each point between the cathode of said odd SMD LED group and the anode of the next even SMD group; said second flexible wire is cut to non-conduction at each point between the cathode of said even SMD LED group and the anode of the next odd SMD group; the anode of said Nth LED group is connected electrically to said third flexible wire; said third flexible wire is the anode of said LED flexible wire lighting, and said first flexible wire is the cathode of said LED flexible wire lighting.

Said first flexible wire, said second flexible wire, and said third flexible wire are a single metal wire or a plurality of twisted metal wires.

All SMD LEDs in each SMD LED group are welded in parallel in the same way. A common anode of all SMD LEDs in a SMD LED group is anode of SMD LED group. A common cathode of all SMD LEDs in a SMD LED group is cathode of SMD LED group.

There are more than two SMD LEDs in said first SMD LED group, said second SMD LED group, . . . , or said Nth SMD LED group. The numbers of SMD LEDs in said SMD LED groups can be equal or be non-equal. In some embodiments, the numbers of SMD LEDs in all said SMD LED groups are equal. Said SMD LED group anode is the electrically parallel connection of all SMD LED anodes in a SMD LED group. Said SMD LED group cathode is the electrically parallel connection of all SMD LED cathodes in a SMD LED group.

There is a plurality of arrangement combinations of said first flexible wire, said second flexible wire, and said third flexible wire. In some embodiments, said first flexible wire, said second flexible wire and said third flexible wire are adhered and fixed by said non-conductive material. Said first flexible wire, said second flexible wire, and said third flexible wire can be manufactured in mass because those wires are adhered and fixed by said non-conductive material. The resistance to tension, and the capability to waterproof are enhanced because those wires are adhered and fixed by said non-conductive material.

In common way, the current loop wire is connected and welded manually without machine automation for the lightings in parallel-series connection or in series-parallel connection. Said third flexible wire can be connected and welded automatically as the current loop wire because said first flexible wire, said second flexible wire and said third flexible wire are adhered and fixed by said non-conductive material. Said first flexible wire, said second flexible wire, and said third flexible wire can be conveniently manufactured as a whole in mass because those wires are adhered and fixed by said non-conductive material, thus the LED flexible wire lighting in parallel-series connection can be manufactured automatically by machines.

In some embodiments, said first flexible wire, said second flexible wire and said third flexible wire are arranged in order as: said first flexible wire is adhered to said second flexible wire by said non-conductive material, said second flexible is adhered to said third flexible wire by said non-conductive material. The automatic control for product manufacture is more easy for that the manufacturing activity is almost on said first flexible wire and said second flexible wire by the ordered arrangement of said first flexible wire, said second flexible wire and said third flexible wire.

In some embodiments, said points cut to non-conduction of said first flexible wire and said second flexible wire are fixed by non-conduction structure between adjacent said SMD LED groups. The resistance to tension of the LED flexible wire lighting are enhanced for the said non-conduction structure.

In some embodiments, said non-conduction structure is a kind of transparent non-conduction structure which is solidified from a flexible material dripped by machine while said flexible wire lighting manufacturing.

In some embodiments, a plurality of points on said first flexible wire and said second flexible wire are open as welding points where said SMD LEDs in each said SMD LED groups are mounted and welded.

In some embodiments, said welding points on said first flexible wire and said second flexible wire are opened from said non-conduct material by mechanical friction. In some embodiments, one SMD LED is welded on one said welding point. In some embodiments, two or more SMD LEDs are welded on one said welding point.

In some embodiments, said welding points on said first flexible wire and said second flexible wire are opened from said non-conduct material by laser ablation.

Said SMD LEDs are encapsulated by transparent non-conduction structures which are solidified from flexible material dripped by machine at said welding points.

In the invention patent, the LED flexible wire lighting in series-parallel connection is disclosed for machine automatic manufacture. The manual welding connection is reduced. The efficiency is higher to down the manufacture cost. And the resistance to tension of lightings in parallel-series connection is enhanced. Thus, the LED flexible wire lighting in series-parallel connection can be manufactured in mass.

BRIEF DESCRIPTION OF DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
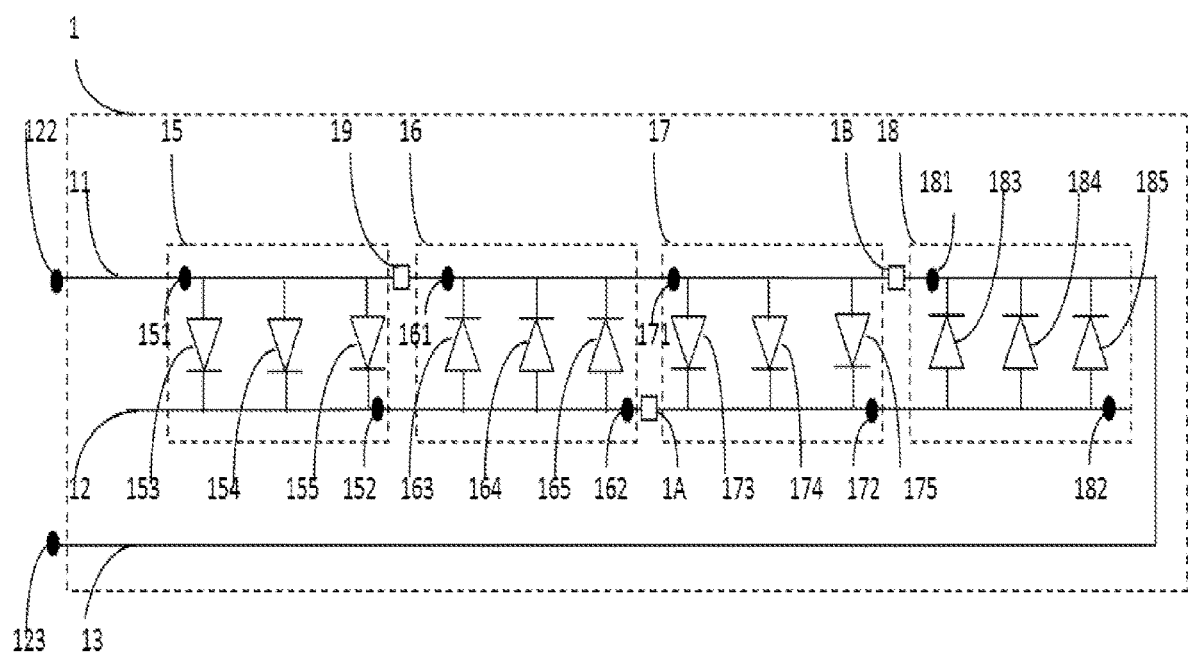
FIG. 1 illustrates an LED flexible wire lighting in parallel-series connection.

As illustrated in FIG. 1, an implemented LED flexible wire lighting in parallel-series connection (1), marked as encircled by the dotted line, comprises:

first flexible wire (11), second flexible wire (12), third flexible wire (13), and four SMD LED groups. The four SMD LED groups are numbered as first SMD LED group (15), second SMD LED group (16), third SMD LED group (17), fourth SMD LED group (18). First SMD LED group (15) and third SMD LED group (17) are odd SMD LED groups. Second SMD LED group (16) and fourth SMD LED group (18) are even SMD LED groups.

The anode (151) of first SMD LED group (15) is connected to first flexible wire (11), and the cathode (152) is connected to second flexible wire (12);

The cathode (161) of second SMD LED group (16) is connected to first flexible wire (11), and the anode (162) is connected to second flexible wire (12). The point (19) between the anode (151) of first SMD LED group (15) and the cathode (161) of second SMD LED group (16) is cut to non-conduction.

The anode (171) of third SMD LED group (17) is connected to first flexible wire (11), and the cathode (172) of third SMD LED group (17) is connected to second flexible wire (12). The point (1A) between the anode (162) of second SMD LED group (16) and the cathode (172) of third SMD LED group (17) is cut to non-conduction.

The cathode (181) of fourth SMD LED group (18) is connected to first flexible wire, and the anode (182) of fourth SMD LED group (18) is connected to second flexible wire (12). The point (1B) between the anode (171) of third SMD LED group (17) and the cathode (181) of fourth SMD LED group (18) is cut to non-conduction.

The cathode (181) of fourth SMD LED group (18) is welded and connected to third flexible wire (13).

As illustrated in FIG. 1, in the implemented LED flexible wire lighting (1), first SMD LED group (15) comprises three SMD LEDs with 0807 size: the SMD LED (153), the SMD LED (154), and the SMD LED (155); second SMD LED group (16) comprises three SMD LEDs with 0807 size: the SMD LED (163), the SMD LED (164), and the SMD LED (165); third SMD LED group (17) comprises three SMD LEDs with 0807 size: the SMD LED (173), the SMD LED (174), and the SMD LED (175); fourth SMD LED group (18) comprises three SMD LEDs with 0807 size: the SMD LED (183), the SMD LED (184), and the SMD LED (185).

The anode (122) of the implemented LED flexible wire lighting (1) is the anode (151) of first SMD LED group (15), and the cathode (123) of the implemented LED flexible wire lighting (1) is third flexible wire (13).

Figure 2:
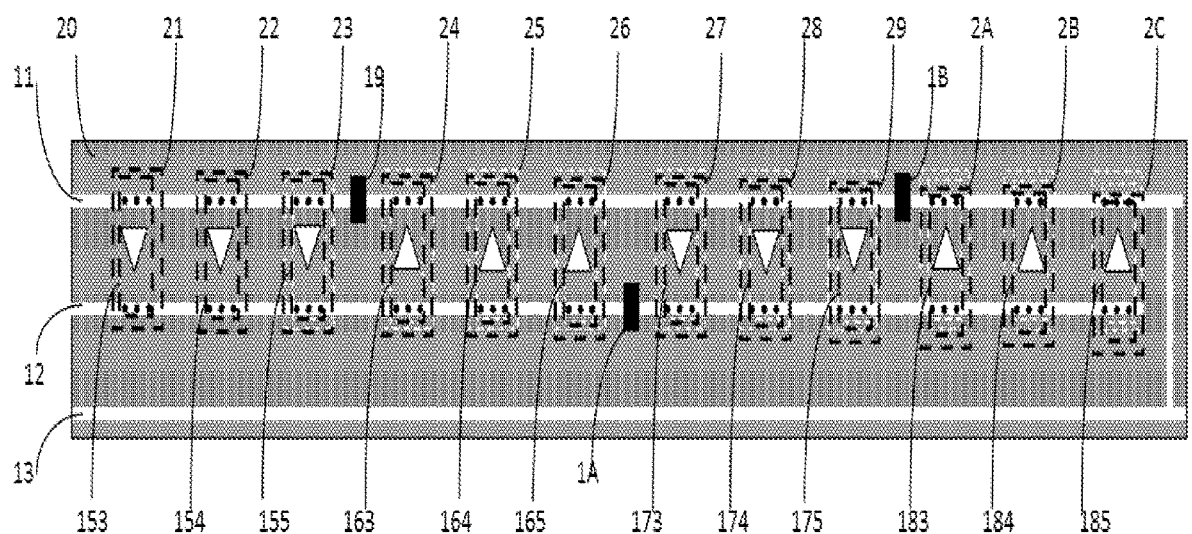
FIG. 2 illustrates the cross-section of the LED flexible wire lighting in parallel-series connection.

FIG. 2 illustrates the cross-section of the LED flexible wire lighting (1) in parallel-series connection. First flexible wire (11), second flexible wire (12), and the third flexible wire (13) are arranged in orderly. First flexible wire (11) and second flexible wire (12) are fixed and adhered by non-conduct material (20), second flexible wire (12) and third flexible wire (13) are fixed and adhered by non-conduct material (20).

As FIG. 2 illustrates, there are twelve welding points (21, 22, 23, 24, 25, 26, 27, 28, 29, 2A, 2B, 2C) on first flexible wire (11) and second flexible wire (12) opened from non-conduct material (20) by laser ablation. The space between two adjacent welding points are 10 cm apart.

As FIG. 2 illustrates, the three SMD LEDs with 0807 size in first SMD LED group (15) are welded on the welding points (21), (22), (23); the anodes of the three SMD LEDs are welded on first flexible wire (11), the cathodes of the three SMD LEDs are welded on second flexible wire (12). The three SMD LEDs with 0807 size in second SMD LED group (16) are welded on the welding points (24), (25), (26); the cathodes of the three SMD LEDs are welded on first flexible wire (11), the anodes of the three SMD LEDs are welded on second flexible wire (12). The three SMD LEDs with 0807 size in third SMD LED group (17) are welded on the welding points (27), (28), (29); the anodes of the three SMD LEDs are welded on first flexible wire (11), the cathodes of the three SMD LEDs are welded on second flexible wire (12). The three SMD LEDs with 0807 size in fourth SMD LED group (18) are welded on the welding points (2A), (2B), (2C); the cathodes of the three SMD LEDs are welded on first flexible wire (11), the anodes of the three SMD LEDs are welded on second flexible wire (12).

As FIG. 2 illustrates, the point (19), the point (1A) and the point (1B) are fixed by a kind of transparent non-conduction structure which is solidified from a flexible material dripped by machine while said flexible wire lighting manufacturing. The resistance to tension of lightings in parallel-series connection is enhanced.

The LED flexible wire lighting in parallel-series connection is implemented for machine automatic manufacture. The manual welding connection is reduced. The efficiency is higher to down the manufacture cost. And the resistance to tension of lightings in parallel-series connection is enhanced.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the invention, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An LED flexible wire lighting in parallel-series connection, comprising:
    first flexible wire, second flexible wire, third flexible wire, and a plurality of surface mounted device (SMD) LED groups;
    said first flexible wire, said second flexible wire and said third flexible wire are enclosed by non-conductive material without conduction among the wires;
    said plurality of SMD LED groups are numbered as first SMD LED group, second SMD LED group, . . . , Nth SMD LED group; said SMD LED groups with odd numbers are odd SMD LED groups, said SMD LED groups with even numbers are even SMD LED groups;
    said plurality of SMD LED groups are connected electrically between said first flexible wire and said second flexible wire in order of said SMD LED groups' number; anodes of said odd SMD LED groups are connected electrically to said first flexible wire, the cathodes of said odd SMD LED groups are connected electrically to said second flexible wire; the cathodes of said even SMD LED groups are connected electrically to said first flexible wire, anodes of said even SMD LED groups are connected electrically to said second flexible wire; said first flexible wire is cut to non-conduction at each point between an anode of an odd SMD LED group; and a cathode of a next even SMD group; said second flexible wire is cut to non-conduction at each point between an anode of an even SMD LED group and a cathode of a next odd SMD group; a cathode of said Nth LED group is connected electrically to said third flexible wire; said third flexible wire is the cathode of said LED flexible wire lighting, and said first flexible wire is the anode of said LED flexible wire lighting;

alternatively:

said plurality of SMD LED groups are connected electrically between said first flexible wire and said second flexible wire in order of said SMD LED groups' number; the cathodes of said odd SMD LED groups are connected electrically to said first flexible wire, the anodes of said odd SMD LED groups are connected electrically to said second flexible wire; the anodes of said even SMD LED groups are connected electrically to said first flexible wire, the cathodes of said even SMD LED groups are connected electrically to said second flexible wire;

said first flexible wire is cut to non-conduction at each point between the cathode of said odd SMD LED group and the anode of the next even SMD group; said second flexible wire is cut to non-conduction at each point between the cathode of said even SMD LED group and the anode of the next odd SMD group; the anode of said Nth LED group is connected electrically to said third flexible wire;

said third flexible wire is the anode of said LED flexible wire lighting, and said first flexible wire is the cathode of said LED flexible wire lighting.

2. The LED flexible wire lighting in parallel-series connection of claim 1, wherein said first flexible wire, said second flexible wire and said third flexible wire are adhered and fixed by said non-conductive material.

3. The LED flexible wire lighting in parallel-series connection of claim 2, wherein said first flexible wire, said second flexible wire and said third flexible wire are adhered in order as: said first flexible wire is adhered to said second flexible wire by said non-conductive material, said second flexible is adhered to said third flexible wire by said non-conductive material.

4. The LED flexible wire lighting in parallel-series connection of claim 3, wherein said points cut to non-conduction of said first flexible wire and said second flexible wire are fixed by non-conduction structure.

5. The LED flexible wire lighting in parallel-series connection of claim 4, wherein said non-conduction structure is a kind of transparent non-conduction structure which is solidified from a flexible material dripped by machine while said flexible wire lighting manufacturing.

6. The LED flexible wire lighting in parallel-series connection of claim 5, wherein a plurality of points on said first flexible wire and said second flexible wire are open as welding points where said SMD LEDs in each said SMD LED groups are mounted and welded.

7. The LED flexible wire lighting in parallel-series connection of claim 6, wherein said SMD LEDs are encapsulate by transparent non-conduction structures which are solidified from flexible material dripped by machine at said welding points.

8. The LED flexible wire lighting in parallel-series connection of claim 1, wherein there are more than 2 SMD LEDs in said first SMD LED group, said second SMD LED group, . . . , and said Nth SMD LED group; there are same number SMD LEDs in said first SMD LED group, said second SMD LED group, . . . , and said Nth SMD LED group.

\* \* \* \* \*